(12) United States Patent
Namiki

(10) Patent No.: US 6,226,599 B1
(45) Date of Patent: *May 1, 2001

(54) ELECTROMAGNETIC WAVE ANALYZER APPARATUS

(75) Inventor: Takefumi Namiki, Kawasaki (JP)

(73) Assignee: Fujitsu Limted, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/923,970

(22) Filed: Sep. 8, 1997

(30) Foreign Application Priority Data

May 3, 1997 (JP) .................................... 9-050376

(51) Int. Cl.$^7$ .................................................. G01R 29/08
(52) U.S. Cl. .................................. 702/57; 702/65; 702/66
(58) Field of Search ................................. 702/57, 66–71, 702/73, 75, 77, 115, 124, 126, 170, 182, 183, 189, 65, 64, FOR 110, FOR 170, FOR 171, FOR 130, FOR 103, FOR 105; 395/500.25, 500.26; 324/76.12, 76.14, 76.21; 343/700 MS; 706/920, 932; 703/3–5, 13

(56) References Cited

U.S. PATENT DOCUMENTS

| 5,566,083 | * | 10/1996 | Fang ................................. 395/500.25 |
| 5,617,104 | * | 4/1997 | Das ................................. 343/700 MS |
| 5,703,787 | * | 12/1997 | Namiki ................................. 702/66 |

OTHER PUBLICATIONS

Toshiaki Kitamura, et al.; "Analysis of Thin Film Microstrip Lines with Conductor Loss Utilizing the Finite Difference Time–Domain Method"; Faculty of Engineering, Osaka University, Suita–shi, 565 Japan, vol. J76–C–I, No. 5, pp. 173–180; May 1993 (with translation—abstract only), (Only the Abstract has been Translated).

John H. Beggs, et al.; "Finite–Difference Time–Domain Implementation of Surface Impedance Boundary Conditions"; IEEE Transactions on Antennas and Propagation, vol. 40, No. 1, Jan. 1992, pp. 49–56.

* cited by examiner

Primary Examiner—Hal Wachsman
(74) Attorney, Agent, or Firm—Staas & Halsey LLP

(57) ABSTRACT

An electromagnetic wave analyzer which computes transitional behavior of electromagnetic waves, taking into account conductor losses in each metal part, without the computation being limited by the metal thickness or angular frequencies. An initialization unit initializes various calculation parameters such as metal thickness d, the number of meshes, mesh sizes, dielectric constant $\in$ of each cell, permeability $\mu$, and electrical conductivity $\sigma$. An analyzing unit uses a finite difference time domain method to solve a given equation under a surface impedance boundary condition in which the surface impedance $z(\omega)$ of a metal part becomes to $1/d\sigma$ when the skin depth $\delta$ approaches infinity (i.e., when the angular frequency $\omega$ approaches zero). The analyzing unit yields a solution that described the transitional behavior of electromagnetic waves and outputs it as a result data file. In this way, the analyzer of the present invention computes transitional behavior of electromagnetic waves, taking into account conductor losses in each metal part, without being affected by the thickness of the metal parts.

4 Claims, 7 Drawing Sheets

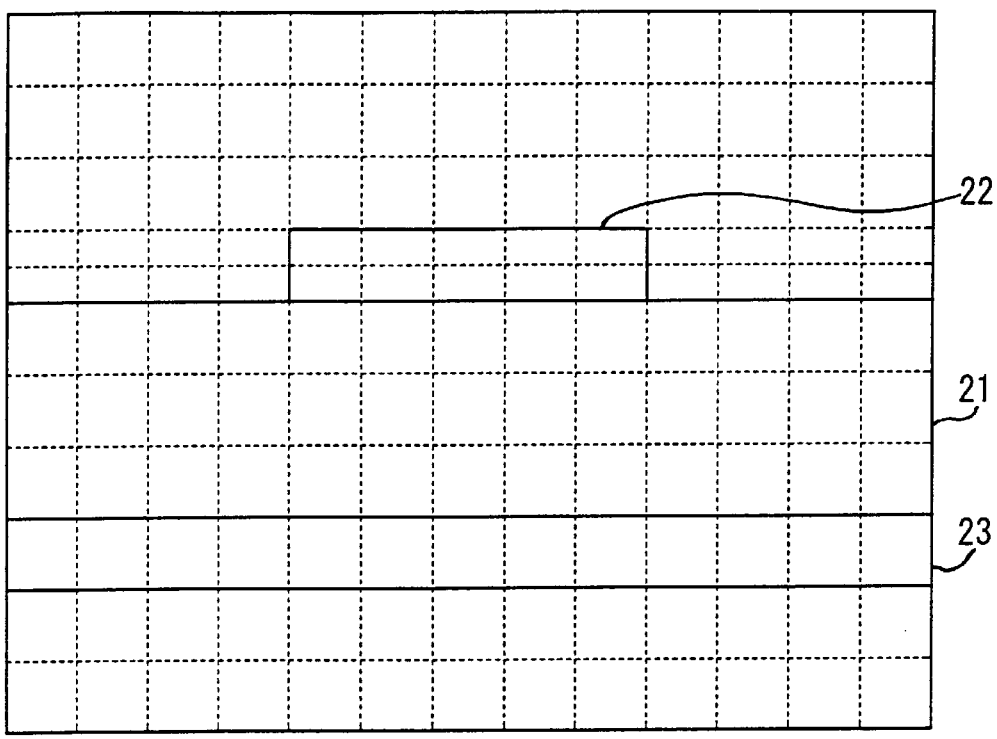
FIG. 7 (A)
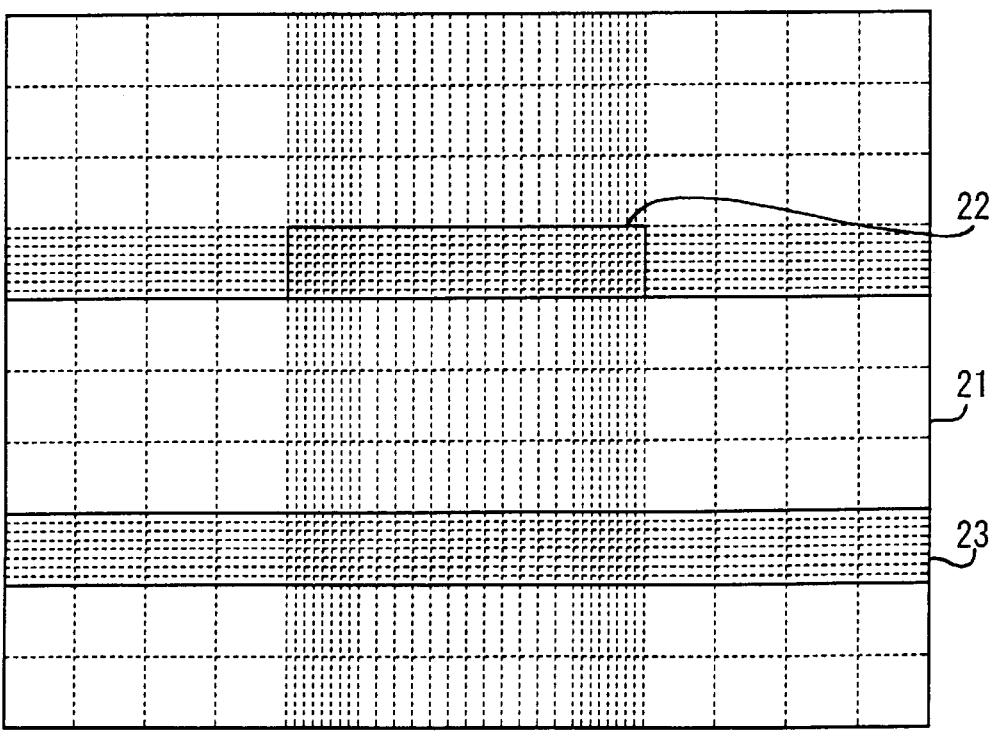
PRIOR ART    FIG. 7 (B)

ELECTROMAGNETIC WAVE ANALYZER APPARATUS

BACKGROUND OF THE INVENTION

1. Field of the Invention

The present invention relates to an electromagnetic wave analyzer apparatus which numerically analyzes the transitional behavior of electromagnetic waves, and more particularly, to an electromagnetic wave analyzer which treats a metal part as a medium having finite electrical conductivity.

2. Description of the Related Art

Today's computational electromagnetics exploits the Finite-Difference Time-Domain (FDTD) method as one of the techniques to analyze the transitional behavior of electromagnetic waves by using a computer for numerical calculation. This FDTD method, which solves the Maxwell's equations in the time and spatial domains using difference methods, is actually used in many different situations because of its wide scope of applications.

In a conventional FDTD-based electromagnetic wave analysis, researchers use either one of the following three techniques particularly when some metallic objects exist in the calculation space.

The first method performs computations on the assumption that every metal part in the calculation space is a perfect conductor that has an infinite electrical conductivity. Hereafter, this method is referred to as the "first conventional method."

In the first conventional method, an electrical wall boundary condition is set on the surface of a metal part as $$E \tan = 0, \qquad (1)$$

where E tan represents an electric field component tangential to the metal part's surface.

This first conventional method is most popularly used, because it requires no computation about the electromagnetic field inside the metal parts. While being useful in many cases, this method is unable to handle such problems where the conductor losses in metal parts are not negligible. In order to solve this type of problems where the perfect conductor assumption is not applicable, it is necessary to introduce another computation algorithm that takes account of an electromagnetic field in a metal part, as will be described below.

The second method deals with the meshes corresponding to a metal part in the same way as those of other objects in the calculation space, while giving a finite electrical conductivity to that part. This method is referred to as the "second conventional method."

The second conventional method can analyze metal objects, taking their conductor losses into account by calculating electromagnetic fields inside of them. For further details of the above-described first and second conventional methods, see the publication of Kitamura et al., IEICE Transaction C-I, Vol. J76-C-I No. 5, May, 1993, pp. 173–180.

The second conventional method, however, has a disadvantage in the processing load imposed on computer platforms. That is, since the electromagnetic field exhibits exponential changes as it goes deep in a metal part, the spatial discretization intervals (or mesh size) must be set to much smaller values in that metal part, compared to those in other portions of the calculation space. Further, when the spatial discretization intervals are reduced, the temporal discretization intervals (or time step size) should also be reduced accordingly. This meshing strategy, however, will lead to a significant increase in both memory capacity and CPU time required for the computation. Therefore, still another calculation method that takes place of the second conventional method is demanded in order for an electromagnetic wave analysis to be conducted in a short time with limited hardware resources.

The third method sets a surface impedance boundary condition proposed by Beggs et al. on the surface of a metal part. Hereafter, this is referred to as the "third conventional method."

More specifically, when the x-axis is defined as an axis in the thickness-wise direction of a metal part, the frequency-domain steady state analysis of an electromagnetic wave Ey in a direction perpendicular to the x-axis is given by $$E_y(\omega) = Z_s(\omega) H_z(\omega), \left( Z_S(\omega) = \sqrt{\frac{j\omega\mu}{\sigma}} \right) \qquad (2)$$

where $\omega$ is angular frequency, $\mu$ is permeability of the metal part, $\sigma$ is electrical conductivity, and j is the imaginary unit.

The time domain transient analysis by the FDTD method based on this expression (2) clarifies the transitional behavior of an electromagnetic wave. Besides eliminating the need for computation of electromagnetic fields inside the metal parts, this method enables the analysis to be executed taking the conductor loss into consideration. The details of this technique is available in the publication of J. H. Beggs et al., IEEE Transaction on Antennas and Propagation, AP40, No. 1, January 1992, pp. 49–56.

The above-described third conventional method uses Beggs's surface impedance boundary condition, assuming that the metal part has a sufficiently large thickness compared to the skin depth $\delta$, where $\delta = (2/\mu\sigma\omega)^{1/2}$. This assumption may be reversely interpreted as a drawback that the third conventional method cannot be applicable to such a case where the metal thickness is not sufficiently larger than the skin depth. This happens, for example, when a researcher tries to analyze the low frequency components of an electromagnetic field.

SUMMARY OF THE INVENTION

Taking the above into consideration, an object of the present invention is to provide an electromagnetic wave analyzer which performs a high-speed computation of transitional behavior of electromagnetic waves, taking into account of conductor losses in each metal part, without restriction of metal thickness or angular frequencies.

To accomplish the above object, according to the present invention, there is provided an electromagnetic wave analyzer apparatus for numerically analyzing transitional behavior of an electromagnetic wave, without calculating electromagnetic field in a metal part.

This electromagnetic wave analyzer apparatus comprises: initialization means for initializing calculation parameters and boundary conditions to be used in a calculation of the transitional behavior of the electromagnetic wave; and analyzing means, coupled to the initialization means, for calculating the transitional behavior of the electromagnetic wave by using a finite difference time domain method, based on a surface impedance boundary condition in which a surface impedance of the metal part becomes $1/d\sigma$ as an angular frequency approaches to zero, where d is thickness of the metal part and $\sigma$ is electrical conductivity.

The above and other objects, features and advantages of the present invention will become apparent from the following description when taken in conjunction with the accompanying drawings which illustrate a preferred embodiment of the present invention by way of example.

BRIEF DESCRIPTION OF THE DRAWINGS

FIG. 7(A) is a diagram showing the meshes according to the present invention; and FIG. 7(B) is a diagram showing the meshes according to the second conventional method.

DESCRIPTION OF THE PREFERRED EMBODIMENTS

An embodiment of the present invention will be described below with reference to the accompanying drawings.

Figure 1:
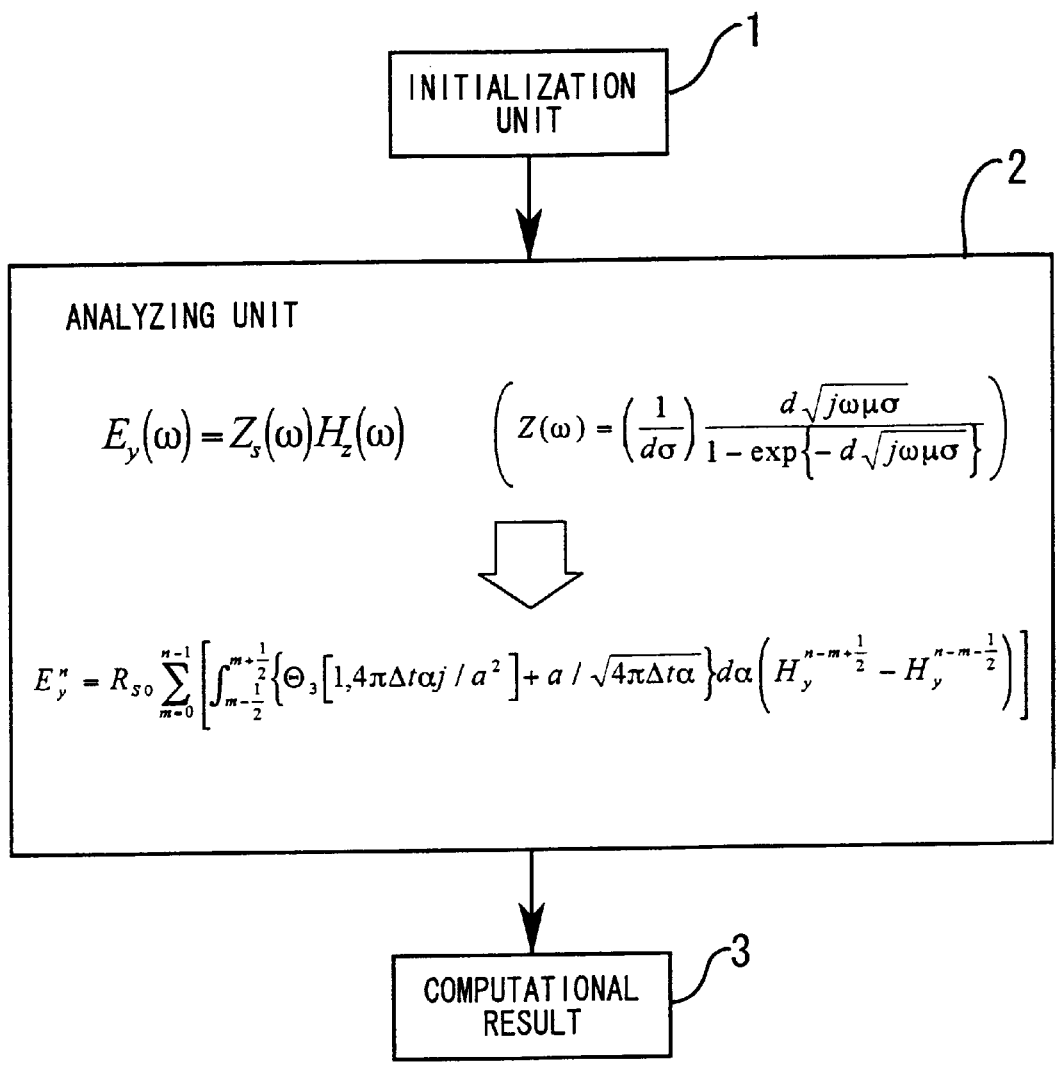
FIG. 1 is a diagram showing the principle of the present invention.

FIG. 1 shows the principle of the present invention. An initialization unit 1 initializes various calculation parameters used in the analysis, such as metal thickness d, the number of meshes, mesh sizes, dielectric constant $\in$ of each cell, permeability $\mu$, and electrical conductivity $\sigma$. The initialization unit 1 also defines a space to be subjected to an electromagnetic wave analysis in consideration of a surface impedance boundary condition.

Based on the initialized calculation parameters, an analyzing unit 2 conducts an electromagnetic wave analysis of a space specified by the initialization unit 1. More specifically, the analyzing unit 2 uses the finite difference time domain method to solve a given equation under such a surface impedance boundary condition that the surface impedance $Z(\omega)$ of a metal part converges to $1/d\sigma$ when the skin depth $\delta$ approaches infinity, or in other words, when the angular frequency $\omega$ approaches zero. While FIG. 1 illustrates some equations used in the computation, they will be explained later on. As a result of the computation, the analyzing unit 2 yields a solution that describes the transitional behavior of electromagnetic waves and outputs it as a computational result 3.

In the way described above, the electromagnetic wave analyzer of the present invention achieves a high-speed computation of transitional behavior of electromagnetic waves, taking into account conductor losses in each metal part, without restriction of metal thickness or angular frequencies.

Next, the following will specifically describe how to obtain an equation to be calculated by the analyzing unit 2.

Figure 2:
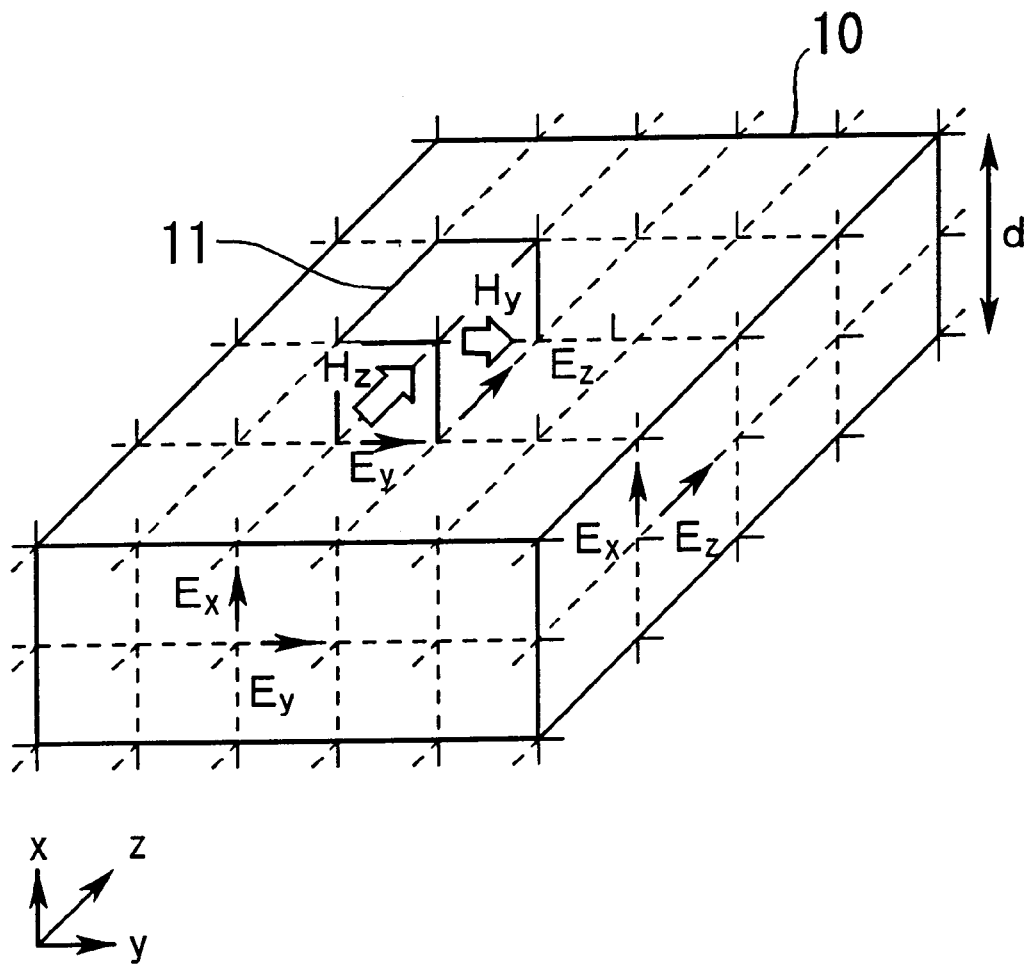
FIG. 2 is a diagram showing a metal part located in a calculation space divided into small meshes.

FIG. 2 is a diagram showing a metal part 10 located in a calculation space divided into small meshes. Here, the x-axis is defined as the thickness-wise direction of the metal part 10, while the y-axis and z-axis are set in the directions perpendicular to this x-axis. The three-dimensional space where this metal part 10 is placed is divided into meshes, or small cells. The metal part 10 is assumed to be a sufficiently wide metallic film having a thickness of d. Note that a cell 11 on the surface of the metal part 10 is subject to calculation of the electromagnetic field analysis in consideration of a surface impedance boundary condition.

Here, the sum I of the currents flowing through a section of the metal part 10 is given by $$I = I_0 \int_0^d \exp\left(-\frac{1+j}{\delta}x\right)dx \qquad (3)$$

$$= I_0 \left(\frac{\delta}{\sqrt{2j}}\right)\left(1 - \exp\left(-\frac{d}{\delta}\sqrt{2j}\right)\right)$$

$$= I_0 \left(\frac{1 - \exp(-d\sqrt{j\omega\mu\sigma})}{\sqrt{\omega\mu\sigma}}\right)$$

where, $I_0$ is the current density on the surface of the metal part 10, j is the imaginary unit, $\delta$ is the skin depth, $\mu$ is the permeability of the metal part 10, $\sigma$ is the electrical conductivity of the metal part 10, and $\omega$ is an angular frequency. Surface impedance $Zs(\omega)$ is then given by $$Z_s(\omega) = R_{S0}d\frac{\sqrt{j\omega\mu\sigma}}{1 - \exp\{-d\sqrt{j\omega\mu\sigma}\}}, \qquad (4)$$

where Rs0 represents the sheet resistance of the metal part 10 with respect to direct current and is equal to $1/d\sigma$. This Equation (4) shows a surface impedance boundary condition applicable to a metallic film whose thickness d is comparable to or less than the skin depth $\delta$.

To apply the FDTD method to the computation of Equation (4), the surface impedance $Zs(\omega)$ should be changed as $$Z'_s = \frac{Z_s(j\omega)}{j\omega} \qquad (5)$$

$$= R_{S0}\left(\frac{a}{\sqrt{j\omega}}\right)\left(\frac{1}{1 - \exp\{-a\sqrt{j\omega}\}}\right)$$

$$= R_{S0}\left(\frac{a}{2\sqrt{j\omega}}\right)\left\{\coth\left(\frac{a}{2}\sqrt{j\omega}\right) + 1\right\},$$

where $a=d(\mu\sigma)^{1/2}$.

Incidentally, the electrical current flowing through the metal part 10 can be represented by the magnetic field. Therefore, the y-axis component Ey of the electromagnetic wave can be expressed as the product of the surface impedance $Zs(\omega)$ and the z-axis component $Hz(\omega)$ of the magnetic field as $$E_y(\omega) = Z_s(\omega)H_z(\omega) \qquad (6)$$

$$= Z'_S(\omega)\{j\omega H_Z(\omega)\}.$$

This Equation (6) is used in the steady state analysis (i.e., the analysis in the frequency domain) of electromagnetic waves.

On the other hand, in order to perform a transient analysis (i.e., the analysis in the time domain) of electromagnetic waves, it is necessary to apply the inverse Fourier transform to $Zs'(\omega)$ shown in Equation (5). $Zs'(t)$ is then obtained as $$Z'_s(t) = F^{-1}[Z'_s(\omega)] = \begin{cases} R_{s0}(\Theta_3[1, 4\pi t j/a^2] + a/\sqrt{4\pi t}) & t > 0 \\ 0 & t \leq 0 \end{cases} \quad (7)$$

where $F^{-1}$ is an inverse Fourier transform operator, and $\Theta_3$ represents an elliptic theta function. The relation between surface impedance and electromagnetic field in the time domain is then expressed by $$E_y(t) = Z'_s(t) \otimes \left\{ \frac{\partial}{\partial t} H_z(t) \right\}, \quad (8)$$

where symbol $\otimes$ represents a convolution operator. Accordingly, that relation can be formulated in the FDTD method by using Equation (7) as $$E_y^n = R_{s0} \int_0^{n\Delta t} (\Theta_3[1, 4\pi\tau j/a^2] + a/\sqrt{4\pi\tau}) \left( -\frac{\partial}{\partial r} H_y^{n\Delta t - r} \right) d\tau \quad (9)$$

$$= R_{s0} \sum_{m=0}^{n-1} \left[ \int_{m-\frac{1}{2}}^{m+\frac{1}{2}} \{ \Theta_3[1, 4\pi\Delta t\alpha j/a^2] + a/\sqrt{4\pi\Delta t\alpha} \} d\alpha \left( H_y^{n-m+\frac{1}{2}} - H_y^{n-m-\frac{1}{2}} \right) \right]$$

where $\tau = \Delta t\alpha$. The above discussion yields the following equation.

$$E_y^n = R_{s0} \sum_{m=0}^{n-1} \left[ \int_{m-\frac{1}{2}}^{m+\frac{1}{2}} \{ \Theta_3[1, 4\pi\Delta t\alpha j/a^2] + a/\sqrt{4\pi\Delta t\alpha} \} d\alpha \left( H_y^{n-m+\frac{1}{2}} - H_y^{n-m-\frac{1}{2}} \right) \right] \quad (10)$$

This Equation (10) is subjected to the analyzing unit 2 for computing the transitional behavior of electromagnetic waves.

The present form of Equation (10), however, is inconvenient for actual computational operations, because it requires all past values of magnetic field components at every time step from the beginning of computation. Here, the integral term in Equation (10) is extracted as $$Z_0(m) = \int_{m-\frac{1}{2}}^{m+\frac{1}{2}} \{ \Theta_3[1, 4\pi\Delta t\alpha j/a^2] + a/\sqrt{4\pi\Delta t\alpha} \} d\alpha, \quad (11)$$

and this Equation (11) will be expanded into a Prony series as $$Z_0(m) \approx \sum_{k=1}^{N} p_k e^{q_k m}. \quad (12)$$

Then Equation (10) can be rewritten as follows.

$$\sum_{m=1}^{n-1} Z_0(m) \left[ H_y^{n-m+\frac{1}{2}} - H_y^{n-m-\frac{1}{2}} \right] = \quad (13)$$

$$\sum_{m=1}^{n-1} \left\{ \sum_{k=1}^{N} p_k e^{q_k m} \right\} \left[ H_y^{n-m+\frac{1}{2}} - H_y^{n-m-\frac{1}{2}} \right]$$

Consider that this Equation (13) equals $$\sum_{k=1}^{N} \Psi_k^n, \quad (14)$$

then the following equation is finally obtained.

$$\Psi_k^n = p_k e^{q_k} \left( H_y^{n-\frac{1}{2}} - H_y^{n-\frac{3}{2}} \right) + e^{q_k} \Psi_k^{n-1} \quad (15)$$

$$(\Psi_k^0 = \Psi_k^1 = 0)$$

This executable form allows the analyzer to solve the equation in a stepwise manner. That is, the computation of Equation (15) requires only two past records of magnetic field components at one time step before and two time steps before the present time. Unlike Equation (10), there is no need to memorize all past values of magnetic field components calculated at every time step from the beginning of the computation. Equation (15) allows the analyzer to solve the problem by sequential operations referring to just a few past results, thus relieving the memory requirement to the computer.

Next, a procedure of the electromagnetic wave analysis performed by the electromagnetic wave analyzer of the present invention will be explained below.

Figure 3:
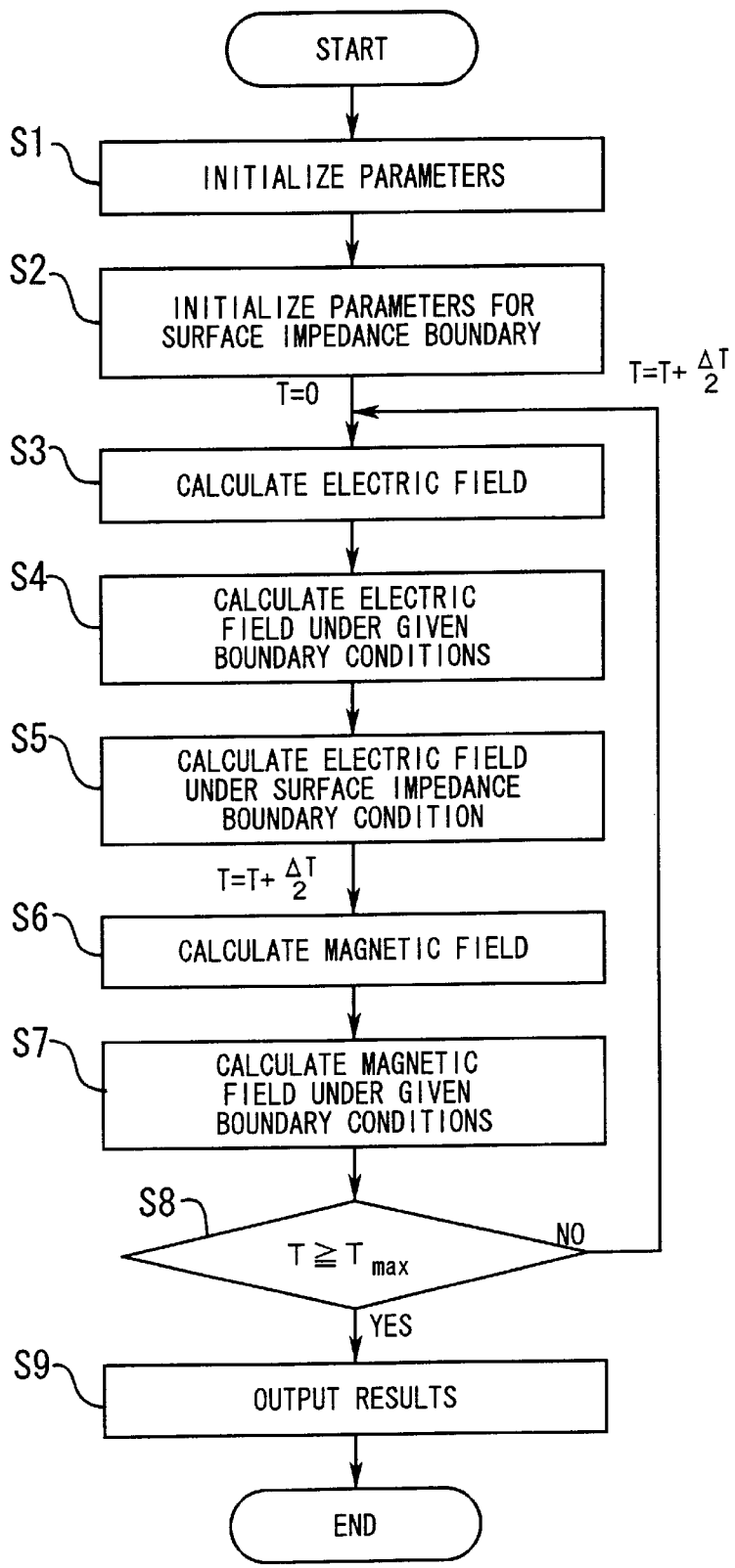
FIG. 3 is a flowchart showing a process of an electromagnetic wave analysis.

FIG. 3 is a flowchart showing a process of the electromagnetic wave analysis, which consists of steps S1 to S9 as detailed below. Note that step S1 is the sole step executed by the initialization unit 1, while the others are processed by the analyzing unit 2.

[S1] The analyzer initializes calculation parameters used in the electromagnetic analysis. Those parameters include the number of meshes, mesh sizes, dielectric constant $\in$ of each cell, permeability $\mu$, electrical conductivity $\sigma$, analysis time Tmax, etc. The analyzer also resets the time counter T to zero.

In this initialization process, the analyzer examines each cell to determine whether it directly depends on any boundary condition or not. About the cells that directly depend on some boundary condition, the analyzer further determines whether it is the surface impedance boundary condition or not. More specifically, cells surrounding a metal part directly depend on the surface impedance boundary condition, while cells at the outer limit of the calculation space are directly affected by an absorbing boundary condition, periodic boundary condition, and the like. The other cells are considered as not directly dependent on any boundary conditions.

[S2] The analyzer initializes parameters for the surface impedance boundary condition. The following is the detail of this second initialization step.

The analyzer first determines to which surface it will apply the surface impedance boundary condition, and then sets electrical conductivity $\sigma$ and metal thickness d to each surface determined.

Next, for a given value of N, the analyzer calculates two coefficients pk and qk for each surface so that the following approximate equation will hold.

$$\int_{m-\frac{1}{2}}^{m+\frac{1}{2}} \{\Theta_3[1, 4\pi\Delta t\alpha j/a^2] + a/\sqrt{4\pi\Delta t\alpha}\}d\alpha \cong \sum_{k=1}^{N} P_k e^{q_k m} \quad (16)$$

The obtained coefficients pk and qk as such are each saved as linear arrays, p(k) and q(k), where k is an integer ranging from 1 to N.

[S3] The analyzer calculates electric fields of the cells that do not directly depend on any boundary conditions.

[S4] The analyzer calculates electric fields of the cells that directly depend on some boundary conditions other than the surface impedance boundary condition.

[S5] The analyzer calculates electric fields of the cells that directly depend on the surface impedance boundary condition. More specifically, the following equation is first evaluated.

$$\Psi^t(k) = P(k)e^{q(k)}\left(H_y^{t-\frac{\Delta t}{2}} - H_y^{t-\frac{3\Delta t}{2}}\right) + e^{q(k)}\Psi^{t-\Delta t}(k) \quad (17)$$

$$(\Psi_k^0 = \Psi_k^{\Delta t} = 0)$$

where k is an integer ranging from 1 to N, and Hy represents a magnetic field that is perpendicular to, but has no intersection with, an electric field E dependent on the surface impedance boundary condition. The electric field E is then given by $$E^t = R_{s0}\sum_{k=1}^{N}\Psi^t(k). \quad (18)$$

[S6] The analyzer calculates magnetic fields while adding a half time step size ΔT/2 to the time T.

[S7] The analyzer calculates magnetic fields which directly depend on the boundary conditions.

[S8] The analyzer examines whether the time T has exceeded the given maximum analysis time Tmax or not. The process advances to step S9 if the time T has exceeded Tmax. Otherwise, the process returns to step S3 after adding ΔT/2 to the time T, thus allowing the computation to be iterated until the time T reaches the maximum time Tmax given for the transient electromagnetic analysis.

[S9] When the electromagnetic wave analysis for the analysis time Tmax has completed, the analyzer outputs the time series data of three-axis electric field components and three-axis magnetic field components obtained through the above computation.

Although the description does not provide the details of steps S3, S4, S6, and S7 shown in the flowchart, it is because the calculations performed in these steps are the same as those in a conventional FDTD-based electromagnetic wave analysis where no surface impedance boundary condition is implemented.

As described above, the electromagnetic wave analyzer of the present invention enables high-speed computation of transitional behavior of electromagnetic waves, while taking account conductor losses of metal parts without restriction of their thickness. Unlike the second conventional method, the proposed method does not require any special fine meshing, and thus it reduces the amount of data handled in the computation, resulting in a less memory requirement to the computer platforms to be used. Further, unlike the third conventional method, the proposed method can be applied to any transient electromagnetic wave analysis, even in such a case that the thickness of a metal part is smaller than that of the skin depth. This means that the present invention is applicable to low-frequency electromagnetic wave analyses.

Next, the following description will present an example of an electromagnetic wave analysis concerning a microstrip transmission line, which is conducted by using the proposed electromagnetic wave analyzer.

Figure 4:
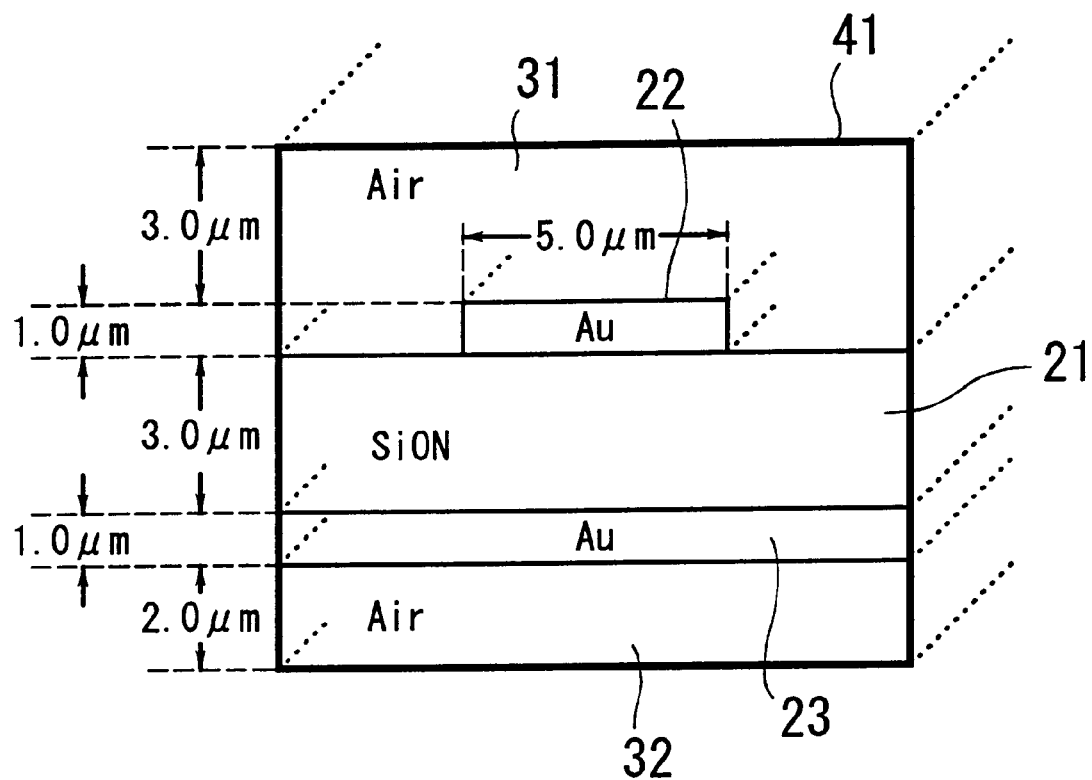
FIG. 4 is a diagram showing a microstrip transmission line.

FIG. 4 illustrates a microstrip transmission line to be analyzed. This microstrip transmission line comprises an SiON substrate 21 and two thin-film conductors 22 and 23 made of Au which are formed on both sides of the substrate 21. The surrounding spaces 31 and 32 are filled with air. An outer frame indicated by a bold line in FIG. 4 shows a section of an absorbing boundary 41.

The thickness of the substrate 21 is 3.0 μm, the thickness of the conductor 22 is 1.0 μm, and the thickness of the conductor 23 is 1.0 μm. The distance between the upper surface of the conductor 22 and the absorbing boundary 41 is 3.0 μm, and the width of the conductor 22 is 5.0 μm. The distance between the underside of the conductor 23 and the absorbing boundary 41 is 2.0 μm. The electrical conductivity σ of Au is $4.167 \times 10^7$ (S/m), and the relative dielectric constant ∈r of SiON is 5.0.

Here, the skin depth δ at a frequency f of 24 GHz is about 0.5 μm since $\delta = 1/(\pi f\mu\sigma)^{1/2}$. This simply means that, in the analysis of electromagnetic waves having the frequencies lower than 24 GHz, the conductors 22 and 23 are not sufficiently thick in comparison with the skin depth. The present embodiment will show a typical output of the electromagnetic wave analyzer of the present invention by making a calculation of the conductor loss vs. frequency characteristics of a microstrip transmission line shown in FIG. 4. The calculated curve will be then compared with the results of the same analysis by the second and third conventional methods. Note that the analysis is conducted in a frequency range from dc to 20 GHz.

Figure 5:
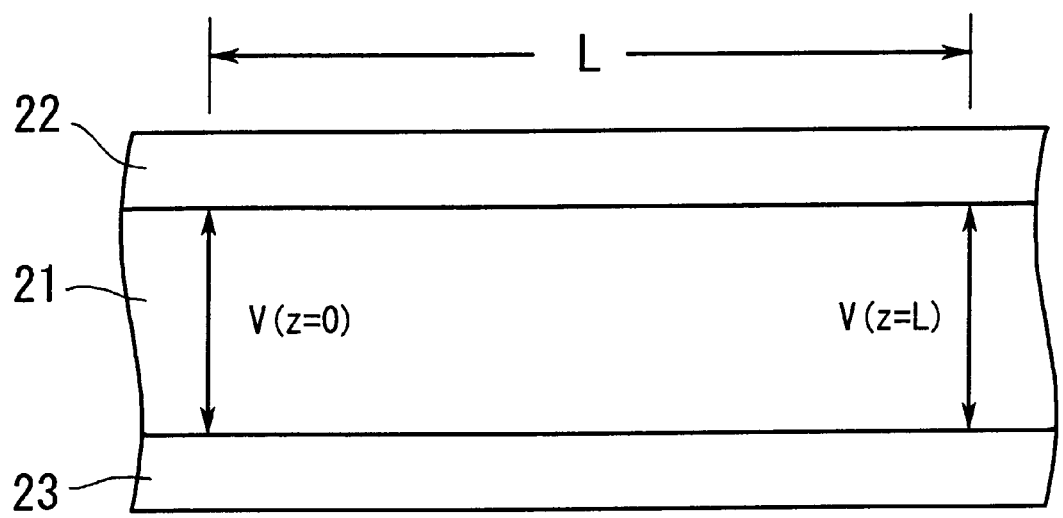
FIG. 5 is a side view of the microstrip transmission line of FIG. 4.

First, the following explains how to calculate the conductor losses. FIG. 5 shows a side view of the microstrip transmission line of FIG. 4. The conductor loss, loss(ω,L), is derived from two potential difference values V(Z=0) and V(Z=L) measured at two separate positions having a predetermined distance L, as $$loss(\omega, L) = R_e\left[-20\log_{10}\left(\frac{V(t, z=0)}{V(t, z=L)}\right)\right], \quad (20)$$

where F is a Fourier transform operator, and Re represents the real part of a complex number.

Figure 6:
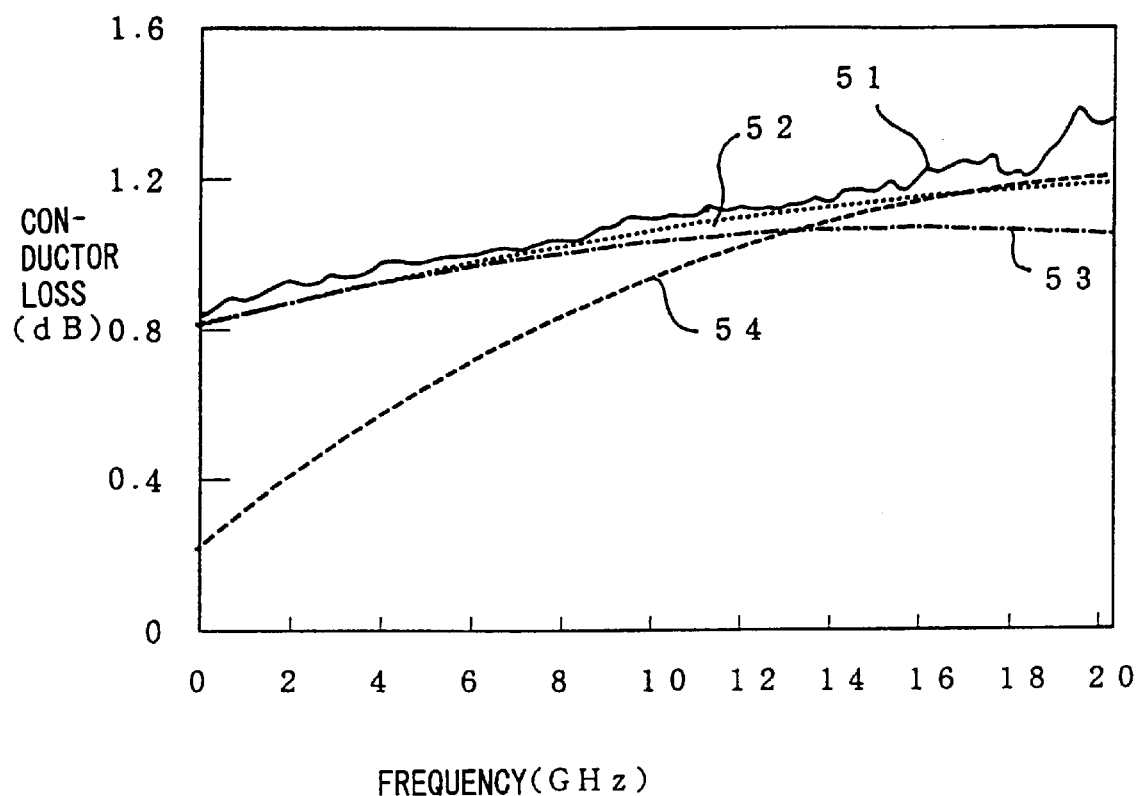
FIG. 6 is a diagram showing the results of a conductor loss analysis.

FIG. 6 is the result of this conductor loss analysis, where the horizontal axis shows frequencies in GHz and the vertical axis represents conductor losses in dB.

Referring to FIG. 6, four different curves 51 to 54 are plotted with different line types for comparison purposes. First, the solid line 51 shows the conductor loss characteristic that was actually measured. On the other hand, the computational result of the present invention is indicated by the dotted line 52. The dot-dash line 53 shows the solution obtained by the second conventional method, in which the meshes corresponding to metal parts are handled in the same way as the other meshes. Lastly, the broken line 54 indicates the result of the third conventional method, in which Beggs' surface impedance boundary condition is set on the surface of each metal part.

FIG. 6 does not include the first conventional method because it only yields zero values for the conductor losses due to its assumption that every metal part is treated as a perfect conductor.

As easily understood from this FIG. 6, the computational results of the present invention and the second conventional method are very close to the actual measurement values. In contrast to those two plots, the third conventional method exhibits larger errors in a lower frequency range.

The present invention and the second conventional method will be further compared in terms of the required memory capacity and required computation time. It should be noted here that the memory capacity and computation time greatly depend on the number of meshes, or cells.

FIGS. 7(A) and 7(B) clarify the difference between the present invention and the second conventional method in configuration of meshes. FIG. 7(A) shows the meshes of the present invention, while FIG. 7(B) shows that of the second conventional method.

In the present invention, the x-axis minimum mesh interval $dx_{min}$ is set to 0.5 μm, while the y-axis minimum mesh interval $dy_{min}$ is 1.0 μm, and the Z-axis minimum mesh interval $dz_{min}$ is 4.0 μm.

Here, the mesh intervals and the temporal discretization interval dt should satisfy the condition given by $$dt \leq \frac{1}{c\sqrt{\left(\frac{1}{dx_{min}}\right)^2 + \left(\frac{1}{dy_{min}}\right)^2 + \left(\frac{1}{dz_{min}}\right)^2}}, \quad (21)$$

where c is the speed of light in a vacuum.

According to this Equation (21), the temporal discretization interval dt in the present invention must be $$dt \leq 1.481(fs). \quad (22)$$

As shown in FIG. 7(A), the number of meshes ($N_{mesh}$) in the present invention is calculated as $$N_{mesh} = nx \times ny \times nz = 12 \times 13 \times nz = 156 \times nz, \quad (23)$$

where nx, ny, and nz show the numbers of divisions in the x-, y-, and z-axis directions, respectively.

On the other hand, according to the second conventional method, the mesh intervals should be reduced within a metal part, particularly in the vicinity of its surfaces. Therefore, the minimum mesh intervals $dx_{min}$ and $dy_{min}$ for the x-axis and y-axis directions are as small as δ/4. Accordingly, the second conventional method sets them as $dx_{min}=0.125$ μm, $dy_{min}=0.125$ μm, and $dz_{min}=4.0$ μm.

Therefore, the temporal discretization interval dt should meet the following condition.

$$dt \leq 0.294(fs). \quad (24)$$

Further, FIG. 7(B) shows that the number of meshes in the second conventional method is $$N_{mesh} = nx \times ny \times nz = 24 \times 36 \times nz = 864 \times nz. \quad (25)$$

The above figures show that the second conventional method requires about 5.5 times larger main storage capacity and 27.7 times longer computation time, when compared to the present invention.

In conclusion of the above comparison, the electromagnetic wave analyzer of the present invention enables a high-speed execution of an electromagnetic field analysis, which effectively works for a low frequency range regardless of metallic film thickness, without impacting on the memory capacity of computer platforms.

The above description is summarized as follows. According to the present invention, an appropriate surface impedance boundary condition is provided, in which the surface impedance of a metal part becomes 1/dσ as the angular frequency approaches to zero. Therefore, even if the skin depth δ is larger than the thickness d of the metal part, the analyzer can calculate transitional behavior of an electromagnetic wave. Moreover, the electromagnetic wave analyzer of the present invention does not require any particular reduction of spatial discretization intervals or temporal discretization interval, because it does not calculate the electromagnetic field inside the metal part. The present invention thus enables high-speed computation of transitional behavior of electromagnetic waves, taking account of conductor losses of metal parts, without restriction of their thickness.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. An apparatus numerically analyzing transitional behavior of an electromagnetic wave near a metal part located in a calculation space divided into meshes, using parameters such as thickness of the metal part, number of meshes, mesh sizes, dielectric cell constants, permeability of the metal part, and electrical conductivity of the metal part, for calculation parameters, comprising:

an initialization device initializing the calculation parameters and surface impedance boundary conditions to be used in a calculation of the transitional behavior of the electromagnetic wave;

an analyzing device, coupled to said initialization device, calculating the transitional behavior of the electromagnetic wave by using finite difference time domain calculations, based on a calculated surface impedance boundary condition in which a surface impedance of the metal part becomes 1/ds as an angular frequency of the electromagnetic wave approaches to zero, where d is thickness of the metal part and s is electrical conductivity of the metal part; and an outputting device, outputting the calculated transitional behavior of the electromagnetic wave to be used in a design of an electrical device containing the metal part.

2. The analyzer apparatus according to claim 1, wherein said calculated surface impedance boundary condition used by said analyzing device is defined as a surface impedance Z(w) given by $$Z(\omega) = \frac{1}{d\sigma} \frac{d\sqrt{j\omega\mu\sigma}}{1 - \exp\{-d\sqrt{j\omega\mu\sigma}\}},$$

where j is an imaginary unit, μ is permeability of the metal part, σ is electrical conductivity of the metal part, d is thickness of the metal part, and ω is the angular frequency.

3. The apparatus according to claim 1, wherein said initialization device specifies a particular area on the metal part the calculated surface impedance boundary condition should be applied, and said analyzing device calculates the transitional behavior of the electromagnetic wave concerning the particular area on the metal part specified by said initialization device.

4. An apparatus for numerically analyzing transitional behavior of an electromagnetic wave near a metal part located in a calculation space divided into meshes, using parameters such as thickness of the metal part, number of meshes, mesh sizes, dielectric cell constants, permeability of the metal part, and electrical conductivity of the metal part, for calculation parameters, comprising:

initialization means for initializing the calculation parameters and surface impedance boundary conditions to be used in a calculation of the transitional behavior of the electromagnetic wave;

analyzing means, coupled to said initialization means for calculating the transitional behavior of the electromagnetic wave by using finite difference time domain calculations, based on a calculated surface impedance boundary condition in which a surface impedance of the metal part becomes 1/ds as an angular frequency of the electromagnetic wave approaches to zero, where d is thickness of the metal part and s is electrical conductivity of the metal part; and outputting means outputting the calculated transitional behavior of the electromagnetic wave to be used in a design of an electrical device containing the metal part.

* * * * *

UNITED STATES PATENT AND TRADEMARK OFFICE
CERTIFICATE OF CORRECTION

PATENT NO. : 6,226,599 B1  
DATED : May 1, 2001  
INVENTOR(S) : Takefumi Namiki

Page 1 of 1

It is certified that error appears in the above-identified patent and that said Letters Patent is hereby corrected as shown below:

<u>Title page,</u>
Item [22], Filing Date,
Change "Sep. 8, 1997" to -- September 5, 1997 --.

Item [30], Foreign Application Priority Data,
Change "May 3, 1997" to -- March 5, 1997 --.

Signed and Sealed this

Twenty-fifth Day of December, 2001

Attest:

Attesting Officer

JAMES E. ROGAN
Director of the United States Patent and Trademark Office

UNITED STATES PATENT AND TRADEMARK OFFICE
CERTIFICATE OF CORRECTION

PATENT NO. : 6,226,599 B1          Page 1 of 1
DATED : May 1, 2001
INVENTOR(S) : Takefumi Namiki It is certified that error appears in the above-identified patent and that said Letters Patent is hereby corrected as shown below:

<u>Title page,</u>
Item [73], Assignee, change "Limted" to -- Limited --.

Signed and Sealed this

Twenty-eighth Day of May, 2001

Attest:

JAMES E. ROGAN
Attesting Officer      Director of the United States Patent and Trademark Office